United States Patent
Narayanan

(10) Patent No.: US 10,051,761 B2
(45) Date of Patent: Aug. 14, 2018

(54) SYSTEMS AND METHODS FOR TWO LAYER THREE DIMENSIONAL TORUS SWITCHED CONNECTIVITY DATACENTER TOPOLOGY

(71) Applicant: DELL PRODUCTS L.P., Round Rock, TX (US)

(72) Inventor: Rajesh Narayanan, San Jose, CA (US)

(73) Assignee: DELL PRODUCTS LP, Round Rock, TX (US)

(*) Notice: Subject to any disclaimer, the term of this patent is extended or adjusted under 35 U.S.C. 154(b) by 87 days.

(21) Appl. No.: 14/967,259

(22) Filed: Dec. 11, 2015

(65) Prior Publication Data

US 2017/0172008 A1     Jun. 15, 2017

(51) Int. Cl.
*H02K 9/24* (2006.01)
*H05K 7/14* (2006.01)

(52) U.S. Cl.
CPC .................................. *H05K 7/1498* (2013.01)

(58) Field of Classification Search
CPC .......................................................... G06F 1/26
USPC ..................................................... 361/679.22
See application file for complete search history.

(56) References Cited

U.S. PATENT DOCUMENTS

| | | |
|---|---|---|
| 5,715,391 A | 2/1998 | Jackson |
| 8,065,433 B2 | 11/2011 | Guo et al. |
| 8,457,135 B2 | 6/2013 | Henry et al. |
| 2015/0295756 A1* | 10/2015 | Yin ............... H04Q 11/0071 370/254 |

\* cited by examiner

*Primary Examiner* — Jerry Wu
(74) *Attorney, Agent, or Firm* — North Weber & Baugh LLP

(57) ABSTRACT

The present invention relates generally to a datacenter environment. Aspects of the present invention include employing a plurality of switches within each datacenter rack. In embodiments of the present invention the switches can be connected in a three dimensional torus topology. In embodiments of the present invention a spine switch can be connected the switches forming a two layer three dimensional topology.

11 Claims, 8 Drawing Sheets

200

400

SYSTEMS AND METHODS FOR TWO LAYER THREE DIMENSIONAL TORUS SWITCHED CONNECTIVITY DATACENTER TOPOLOGY

BACKGROUND

Field of Invention

The present invention relates generally to data networks and devices, and relates more particularly to a two layer three dimensional topology in a data center.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems provide increasingly more central and critical operations in modern society, it is important that the networks are reliable. One method used to improve reliability is to provide a data center. Datacenters are used to store large amounts of data on a plurality of racks within the data center.

FIG. 1 shows a typical top view of the racks in the datacenter. FIG. 1 shows top of rack 105, top of rack 110, top of rack 115, top of rack 120, top of rack 125, top of rack 130, top of rack 135, top of rack 140, top of rack 145, top of rack 150, top of rack 155, and top of rack 160.

While leaf-spine architectures have been in existence for about a decade in datacenter deployments, they are not the most efficient design in terms of overall cross sectional bandwidth and short diameter. However, they can be implemented easily in datacenter environments.

One of the primary issues with existing datacenter design its inherent limitation for scalability. Existing data center network designs like leaf-spine architecture have a number of issues. For example scaling to 1 million nodes requires a very deep spine of 16 layers. This spine becomes difficult to manage and requires a great deal of complexity.

Accordingly, what is needed is to solve this issue, by achieving a more efficient topology in a datacenter so that the datacenter can be scaled.

BRIEF DESCRIPTION OF THE DRAWINGS

Reference will be made to embodiments of the invention, examples of which may be illustrated in the accompanying figures, in which like parts may be referred to by like or similar numerals. These figures are intended to be illustrative, not limiting. Although the invention is generally described in the context of these embodiments, it should be understood that it is not intended to limit the spirit and scope of the invention to these particular embodiments. These drawings shall in no way limit any changes in form and detail that may be made to the invention by one skilled in the art without departing from the spirit and scope of the invention.

DESCRIPTION OF THE PREFERRED EMBODIMENTS

Figure 1:
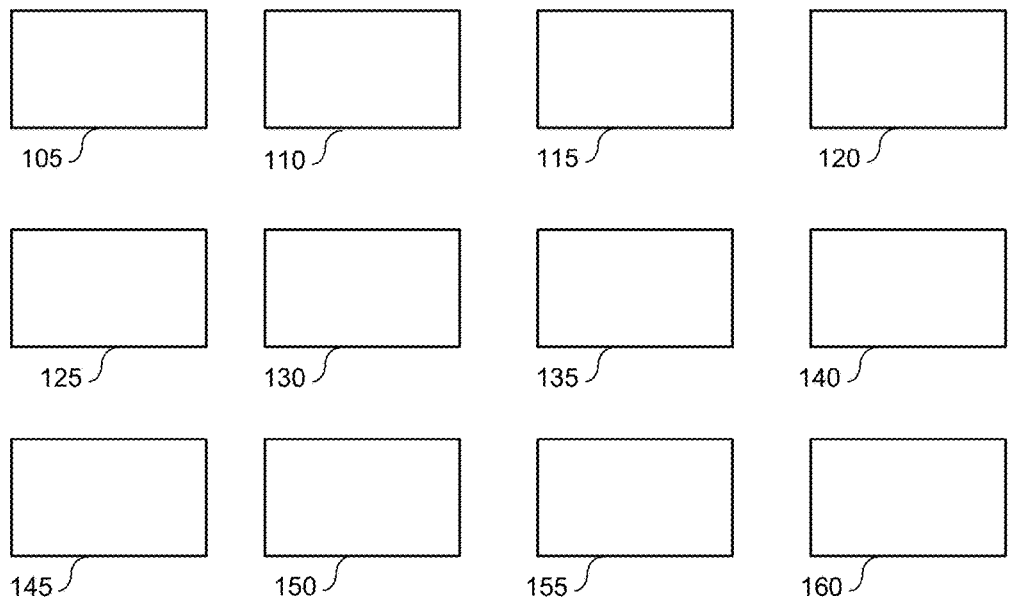
FIG. 1 depicts a prior art top view of a datacenter according to embodiments in this patent document.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled"

shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

The terms "packet," "datagram," "segment," or "frame" shall be understood to mean a group of bits that can be transported across a network. These terms shall not be interpreted as limiting embodiments of the present invention to particular layers (e.g., Layer 2 networks, Layer 3 networks, etc.); and, these terms along with similar terms such as "data," "data traffic," "information," "cell," etc. may be replaced by other terminologies referring to a group of bits, and may be used interchangeably.

Furthermore, it shall be noted that: (1) certain steps may optionally be performed; (2) steps may not be limited to the specific order set forth herein; (3) certain steps may be performed in different orders; and (4) certain steps may be done concurrently.

The present invention relates in various embodiments to devices, systems, methods, and instructions stored on one or more non-transitory computer-readable media involving the communication of data over networks. Such devices, systems, methods, and instructions stored on one or more non-transitory computer-readable media can result in, among other advantages, the ability to use a three dimensional torus topology in a datacenter environment.

It shall also be noted that although embodiments described herein may be within the context of a three dimensional torus topology, the invention elements of the current patent document are not so limited. Accordingly, the invention elements may be applied or adapted for use in other contexts.

Figure 2:
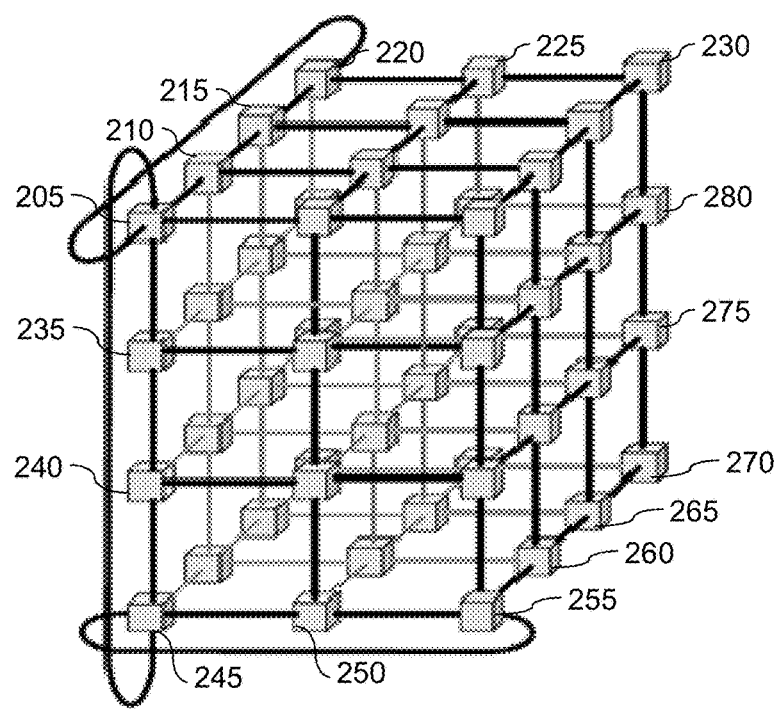
FIG. 2 depicts a block diagram of an embodiment of a three dimensional torus topology according to embodiments in this patent document.

FIG. 2 depicts a block diagram of an embodiment of a three dimensional torus topology according to embodiments in this patent document. In the present invention this topology can be created by adding switches to a datacenter rack. The blocks in FIG. 2 depict these switches. The lines in FIG. 2 depict the wiring in the datacenter in a three dimensional torus topology.

In a three dimensional torus topology a three dimensional grid of rows and columns can be formed. FIG. 2 depicts this grid, where a column is formed by switches 205, 235, 240, and 245 and also by switches 230, 280, 275, and 270. A row is formed by switches 205, 210, 215, and 220 and also by switches 220, 225, and 230. Several other rows and columns of switches are also depicted in FIG. 2, but for simplicity are not numbered. Each row has a left or front switch, depending on the orientation to the cube, switch 205, 235, 240, and 245. Each row also has a right or rear switch, depending on the orientation to the cube, switch 230, 280, 275, and 270. Each column has a top switch 205, 210, 215, 220, 225, and 230. Each column also has a bottom switch 245, 250, 255, 260, 265, and 270. Each row and column also has internal switches that have an adjacent neighbor switch, 210, 215, 235, 240, 250, 260, 265, and 225. The switches can each be connected to their adjacent neighbor switch. The left and right ends of a particular row can be connected to each other as can the top and bottom ends of a column as shown in FIG. 2.

Each column represents a datacenter rack. For example, column 205, 235, 240, and 245 can be in one datacenter rack. The example depicted uses four switches per datacenter rack. However, one of ordinary skill in the art will understand that the number four was used for illustration only and the invention is not so limited. For example, two switches per datacenter rack can be used and connected in a three dimensional torus topology. Alternatively, three, four, or more switches can be implemented in various embodiments of the present invention.

Figure 3:
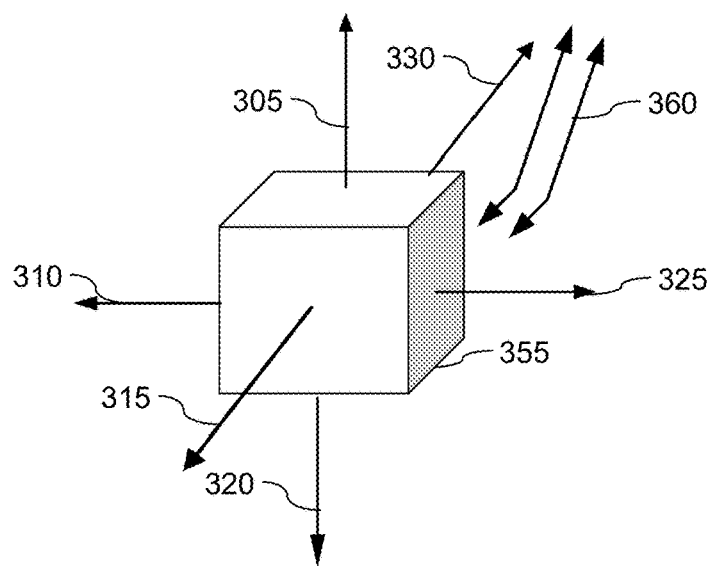
FIG. 3 depicts a block diagram of a switch in a three dimensional torus topology datacenter according to embodiments in this patent document.

In the example shown in FIG. 2 each node has at least 6 connections to its neighbors. In a pure hypercube design each node is considered to be a Compute node (e.g. server). If each node is a switch instead of a server then it is referred to as a three dimensional hyperbus architecture. A three dimensional torus is when any set of entities are connected to each other in a physical or virtual manner as shown in FIG. 2. So a three dimensional torus architecture where each node is a switch is called Hyperbus. If these nodes are compute systems then it is called hypercube FIG. 3 depicts a block diagram of a switch in a three dimensional torus topology datacenter according to embodiments in this patent document.

In embodiments of the present invention a scalable two layer three dimensional hyperbus datacenter design can be used. In FIG. 3, the connectivity for each node can be modified. The modifications include adding a couple of pairs of links for redundancy to the above FIG. 2 to create a three dimensional torus topology. These links can be high-speed links 40G, 100G or more.

In embodiments of the present invention each node 355 can connect to each of its neighbor nodes using connections 305, 310, 315, 320, 325, and 330. In embodiments, each switch can connect to at least six neighbors. Also, connections 365 can be used to connect the node to a spine switch via a dual-homed connection. The spine switch layer can also have its own three dimensional torus topology.

Figure 4:
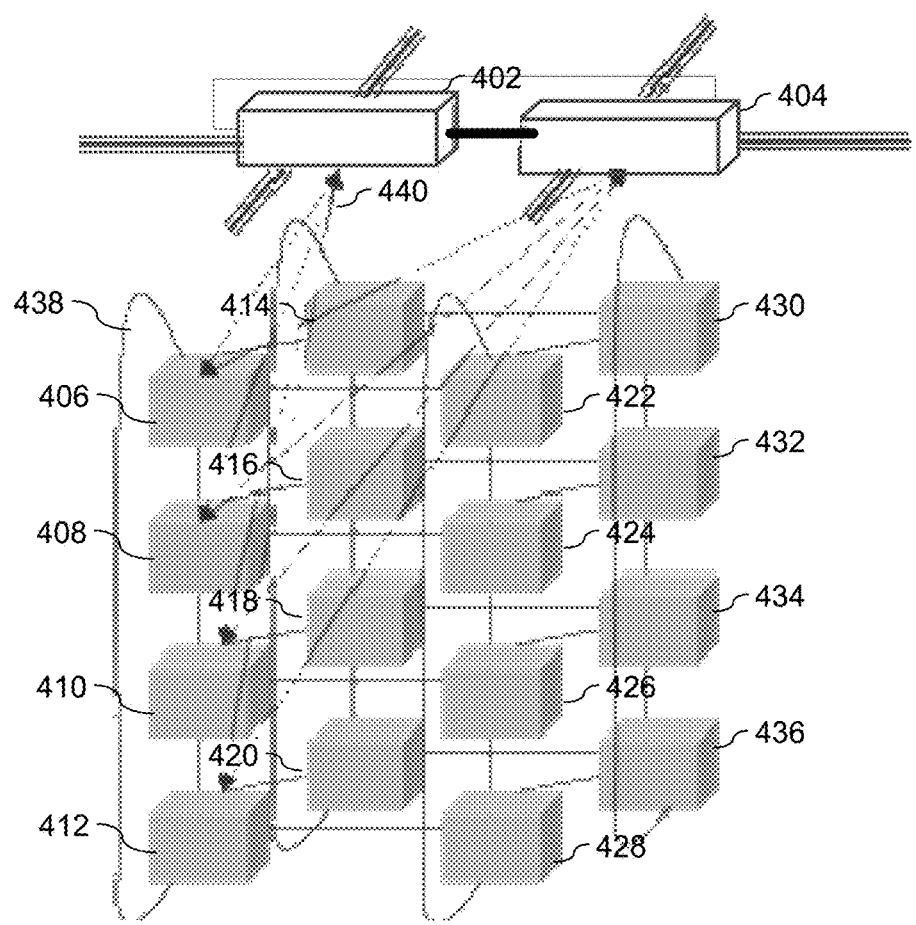
FIG. 4 depicts another block diagram of an embodiment of a three dimensional torus topology in a datacenter according to embodiments in this patent document.

FIG. 4 depicts another block diagram of an embodiment of a three dimensional torus topology in a datacenter according to embodiments in this patent document. FIG. 4 shows a simplified three dimensional torus topology including spine switch connectivity. The simplification is for the ease of illustration and discussion only and is not intended to limit the present invention.

FIG. 4 shows how each switch is connected to the spine switches in a three dimensional torus topology. In embodiments of the present invention shown in FIG. 4 each node or leaf switch can be connected to two spine-switches (dual-homed) for redundancy purposes.

FIG. 4 shows switch grid 406, 408, 410, 412, 414, 416, 418, 420, 422, 424, 426, 428, 430, 432, 434, and 436. FIG. 4 also shows spine switches 402 and 404. FIG. 4 also shows the connectivity between the switches, for example, connection 438 (not all individual connections are individually numbered). FIG. 4 also shows the connections between the spine switches and the switches 440. Again, for the sake of simplicity with illustration and discussion, not all the connections are individually numbered.

FIG. 4 shows four switches per datacenter rack. However embodiments of the present invention are not limited to four switches. Fewer or greater than four can also be used.

Figure 5:
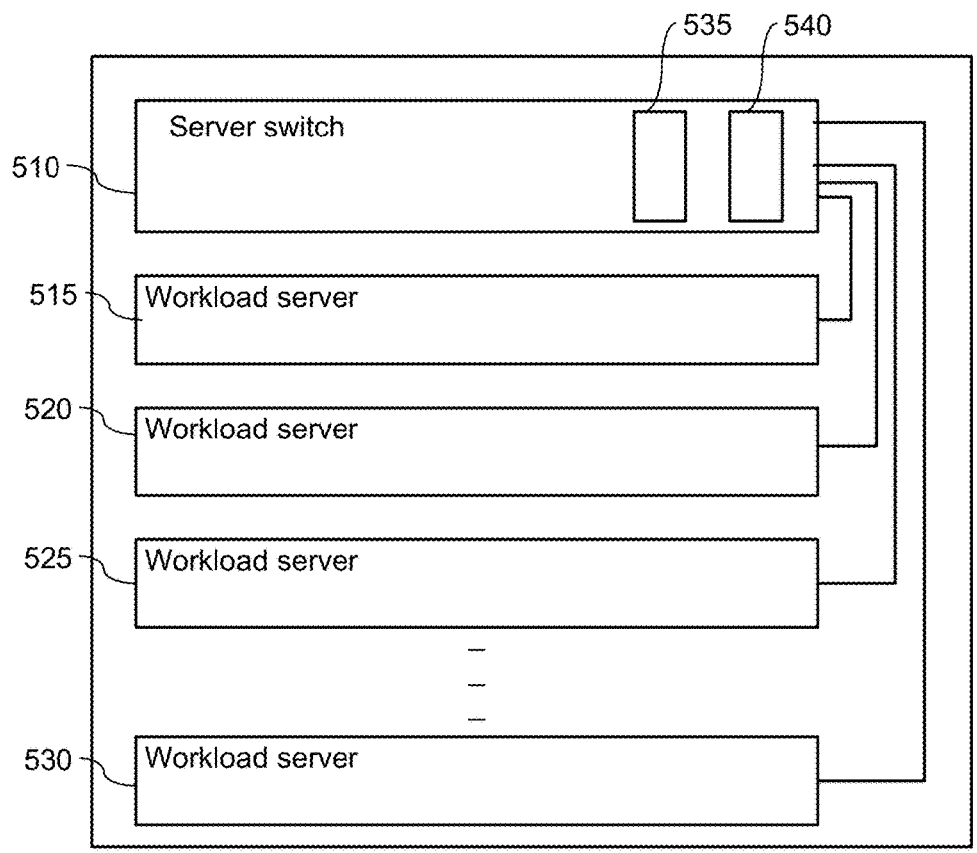
FIG. 5 depicts another block diagram of an embodiment of a three dimensional torus topology in a datacenter according to embodiments in this patent document.

FIG. 5 depicts another block diagram of an embodiment of a three dimensional torus topology in a datacenter according to embodiments in this patent document.

FIG. 5 shows how each node can be implemented as a combination of server-switch 510 and workload servers 515, 520, 525, and 530. Each node can be up to 10 Us (in FIG. 5), 4xnodes yield 40 Us which is typically the height of a single datacenter rack. FIG. 5 also shows switch network interface controllers (NIC) 535 and 540. Each server switch can be connected to a plurality of workload servers 515, 520, 525, and 530. Although four workload servers are shown, any number of workload servers can be implemented.

Figure 6:
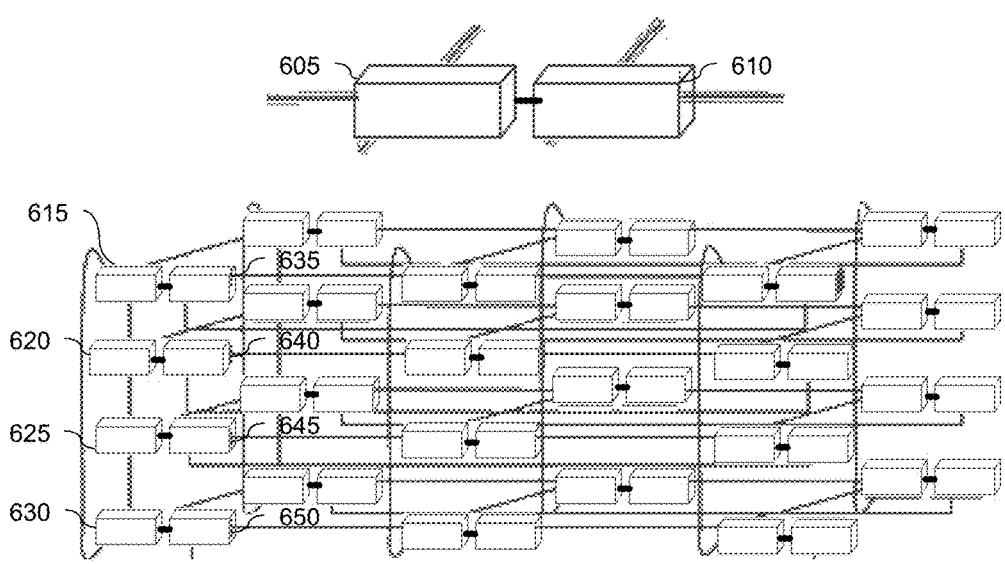
FIG. 6 depicts another block diagram of an embodiment of a three dimensional torus topology in a datacenter according to embodiments in this patent document.

FIG. 6 depicts another block diagram of an embodiment of a three dimensional torus topology in a datacenter according to embodiments in this patent document.

FIG. 6 is similar to FIG. 2 showing a three dimensional hyperbus design. FIG. 6 shows spine-switch pairs 615, 635, 620, 640, 625, 645, and 630 and 650. Again for the ease of discussion and illustration, not all the spine-switch pairs are numbered in the figure. Spine switch pairs 605 and 610 illustrate the need to for at least six links to connect to the adjacent nodes.

In FIG. 6, each spine-pair yields 6 links or link-groups. In the case for the S6000 Dell Switch, which has 32×40 Gbps ports, there are a total of 160 Gbps per link-group.

The spine switch pairs 615 and 635, 620 and 640, 625 and 645, and the other spine switch pairs shown and not numbered, can be connected in a three dimensional torus topology as shown. Each of the spine switches 615, 620, 625, 630, 635, 640, and 645 can also be connected to each switch shown in FIGS. 2 and 4. The switches shown in FIGS. 2 and 4 provide one layer of the three dimensional torus topology. The spine switch layer provides another layer of the three dimensional torus topology.

In the example shown in FIG. 6, each spine-pair can be connected to 4 racks as shown in FIG. 3.

Figure 7:
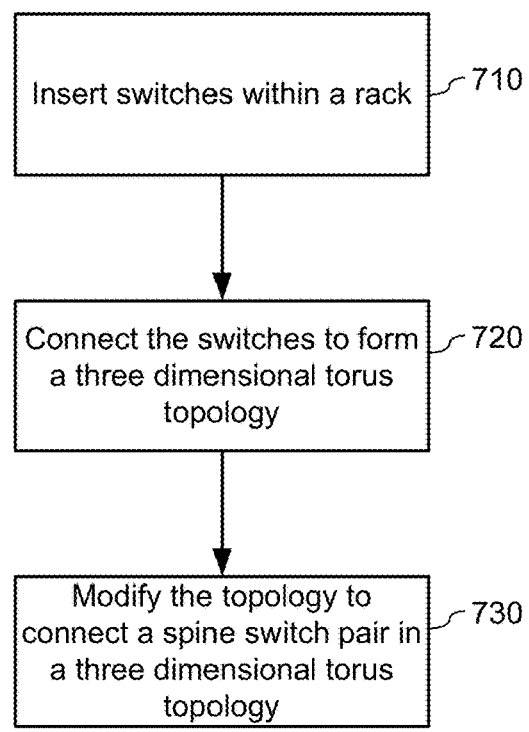
FIG. 7 depicts a flow chart showing a process of implementing of a three dimensional torus topology in a datacenter according to embodiments in this patent document.

FIG. 7 depicts a flow chart showing a process of implementing a two layer three dimensional torus topology in a datacenter according to embodiments in this patent document. FIG. 7 shows inserting switches with a datacenter rack 710. Any number of switches can be inserted. However, four or fewer switches is typically a sufficient number of switches. FIG. 7 also shows connecting the switches to form a three dimensional torus topology 720. This connection can be achieved by connecting each switch to its adjacent neighbor switch. The switches at the ends of each row and column can also be connected to the corresponding switch at the opposite end of the row or column.

FIG. 7 also shows modifying the topology to connect a spine switch 730. A spine switch can also be connected to the switches inserted. Also, the spine switches can achieve a three dimensional torus topology.

There are significant advantages to using a three dimensional torus topology. One advantage is a three dimensional torus topology design provides the maximum bisectional bandwidth compared to prior art data-center leaf-spine designs.

Another advantage is that has the smallest diameter as the maximum number of hops between two nodes is smaller that of a leaf-spine design (by at least 50% in the best case).

Yet another advantage is that this design achieves datacenter scalability, higher cross section bandwidth, and lower hop-counts.

Yet another advantage is that this design also uses spine-pairs (two spines connected to each other to create a single node) nodes to yield 6 adjacent links on the same switch. This design allows us to maximize redundancy while still keeping with the existing dual-homing design.

Unlike leaf-spine architecture, at very high scalability, spine-switches may never connect to other leaf-switches. However in case of three dimensional torus architecture, spine-pairs always maintain 2 hop connectivity to a compute node.

One of ordinary skill in the art will appreciate that various benefits are available as a result of the present invention.

Figure 8:
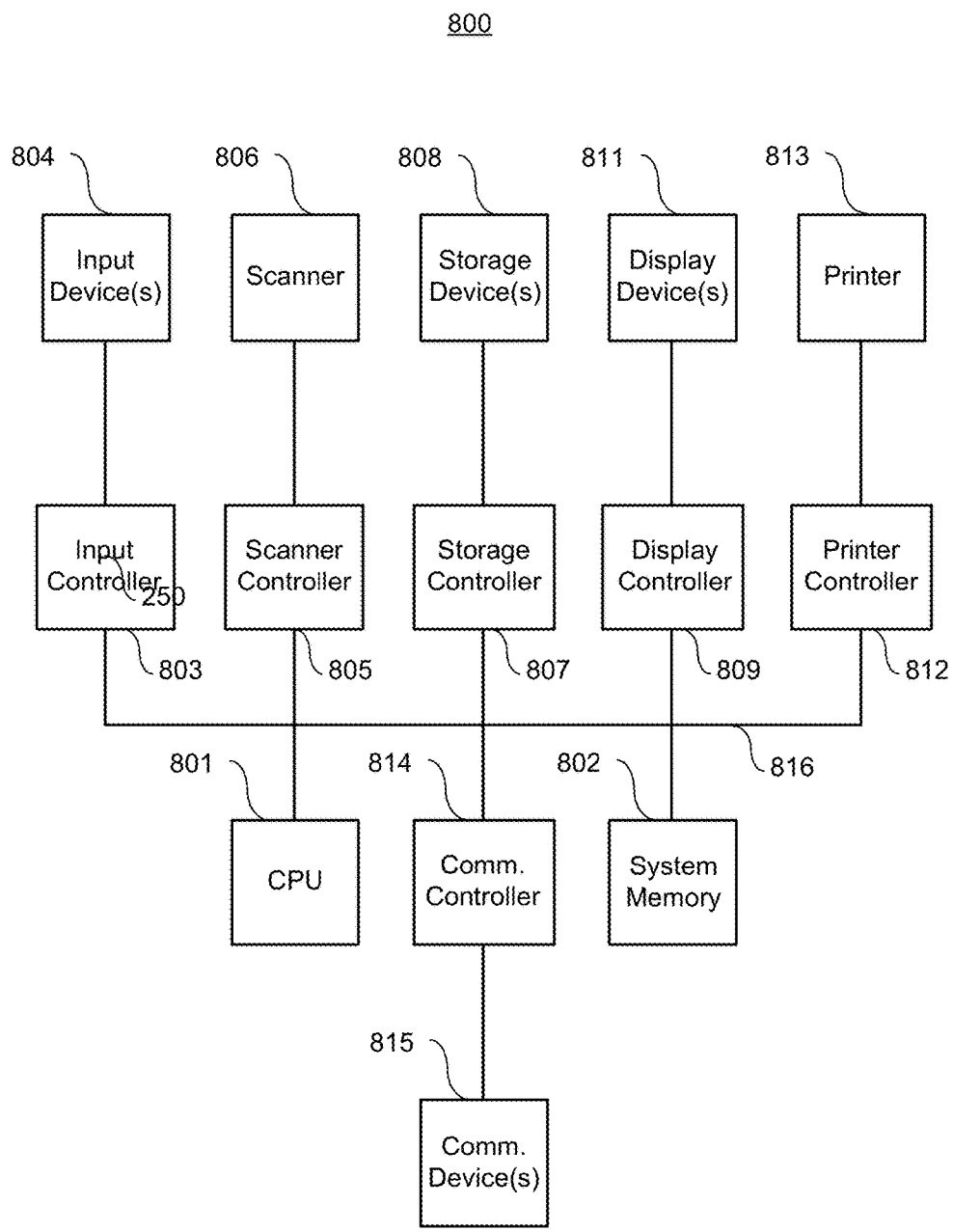
FIG. 8 depicts a block diagram of an information handling system 800 according to embodiments in this patent document.

FIG. 8 depicts a block diagram of an information handling system 800 according to embodiments in this patent document. It will be understood that the functionalities shown for system 800 may operate to support various embodiments of an information handling system—although it shall be understood that an information handling system may be differently configured and include different components. As illustrated in FIG. 8, system 800 includes a central processing unit (CPU) 801 that provides computing resources and controls the computer. CPU 801 may be implemented with a microprocessor or the like, and may also include a graphics processor and/or a floating point coprocessor for mathematical computations. System 800 may also include a system memory 802, which may be in the form of random-access memory (RAM) and read-only memory (ROM).

A number of controllers and peripheral devices may also be provided, as shown in FIG. 10. An input controller 803 represents an interface to various input device(s) 804, such as a keyboard, mouse, or stylus. There may also be a scanner controller 805, which communicates with a scanner 806. System 800 may also include a storage controller 807 for interfacing with one or more storage devices 808 each of which includes a storage medium such as magnetic tape or disk, or an optical medium that might be used to record programs of instructions for operating systems, utilities and applications which may include embodiments of programs that implement various aspects of the present invention. Storage device(s) 808 may also be used to store processed data or data to be processed in accordance with the invention. System 800 may also include a display controller 809 for providing an interface to a display device 811, which may be a cathode ray tube (CRT), a thin film transistor (TFT) display, or other type of display. The computing system 800 may also include a printer controller 812 for communicating with a printer 813. A communications controller 814 may interface with one or more communication devices 815, which enables system 800 to connect to remote devices through any of a variety of networks including the Internet, an Ethernet cloud, an FCoE/DCB cloud, a local area network (LAN), a wide area network (WAN), a storage area network (SAN) or through any suitable electromagnetic carrier signals including infrared signals.

In the illustrated system, all major system components may connect to a bus 816, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Embodiments of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiment are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

What is claimed is:

1. A system, comprising: a plurality of leaf nodes arranged in a first three-dimensional torus topology; a plurality of spine switches pairs, each spine switch in each spine switch pair connects to each other to create a spine-switch-pair node and the spine-switch-pair nodes arranged in a second three-dimensional torus topology; and at least one leaf node of the plurality of leaf nodes being communicatively coupled to a spine switch pair of the plurality of spine switch pairs in the second three-dimensional torus topology via two connections in which one connection connects to one spine switch of the spine switch pair and the other connector connects to the other spine switch of the spine switch pair.

2. The system of claim 1, wherein, in the first three-dimensional torus topology, the plurality of leaf nodes are arranged at least logically in a three-dimensional grid of rows and columns.

3. The system of claim 2, wherein one column in the three-dimensional grid represents a single datacenter rack.

4. The system of claim 1, wherein each leaf node of the plurality of leaf nodes comprises a switch.

5. The system of claim 1, wherein at least one leaf node of the plurality of leaf nodes comprises a server switch dually connected to a spine switch pair in the second three-dimensional torus topology and one or more workload servers communicatively connected to the server switch.

6. The system of claim 1, wherein, in the second three-dimensional torus topology, the plurality of spine switch pairs are arranged at least logically in a three-dimensional grid of rows and columns.

7. The system of claim 1, further comprising:
a plurality of leaf nodes arranged in a third three-dimensional torus topology, at least one leaf node of the plurality of leaf nodes in the third three-dimensional torus topology being communicatively coupled to a spine switch pair of the plurality of spine switch pairs in the second three-dimensional torus topology.

8. A system, comprising: a leaf node at least logically connected to a plurality of leaf nodes to form a first three-dimensional torus topology; and the leaf node being communicatively connected to a spine switch pair of a plurality of spine switch pairs, each spine switch in each spine switch pair connects to each other to create a spine-switch-pair node and the spine-switch-pair nodes in the plurality of spine switch pairs being arranged in a second three-dimensional torus topology, wherein the leaf node comprises two connections in which one connection connects to one spine switch of the spine switch pair and the other connector-connects to the other spine switch of the spine switch pair.

9. The system of claim 8, wherein, in the first three-dimensional torus topology, the plurality of leaf nodes are arranged at least logically in a three-dimensional grid of rows and columns.

10. The system of claim 8, wherein the leaf node comprises a server switch dually connected to the spine switch pair and one or more workload servers communicatively connected to the server switch.

11. The system of claim 8, further comprising:
a plurality of leaf nodes to form a third three-dimensional torus topology, at least one leaf node of the plurality of leaf nodes in the three-dimensional torus topology being communicatively coupled to a spine switch pair of the plurality of spine switch pairs in the second three-dimensional torus topology.

* * * * *